(12) United States Patent
Higuchi et al.

(10) Patent No.: US 12,362,098 B2
(45) Date of Patent: Jul. 15, 2025

(54) CAPACITOR AND ETCHING METHOD

(71) Applicant: KABUSHIKI KAISHA TOSHIBA, Tokyo (JP)

(72) Inventors: Kazuhito Higuchi, Yokohama (JP); Kazuo Shimokawa, Yokohama (JP); Susumu Obata, Yokohama (JP); Mitsuo Sano, Kamakura (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 292 days.

(21) Appl. No.: 18/315,123

(22) Filed: May 10, 2023

(65) Prior Publication Data

US 2023/0307184 A1 Sep. 28, 2023

Related U.S. Application Data

(62) Division of application No. 16/998,019, filed on Aug. 20, 2020, now Pat. No. 11,688,557.

(30) Foreign Application Priority Data

Sep. 20, 2019 (JP) .................................. 2019-171157

(51) Int. Cl.
*H01G 4/228* (2006.01)
*H01G 4/012* (2006.01)
(Continued)

(52) U.S. Cl.
CPC ............. *H01G 4/228* (2013.01); *H01G 4/012* (2013.01); *H01G 4/30* (2013.01); *H01G 4/33* (2013.01);
(Continued)

(58) Field of Classification Search
None
See application file for complete search history.

(56) References Cited

U.S. PATENT DOCUMENTS 8,173,541 B2   5/2012   Andry
9,117,802 B2   8/2015   Parsey, Jr.
(Continued)

FOREIGN PATENT DOCUMENTS

EP   0 580 880 A1   2/1994
JP   5-160109 A     6/1993
(Continued)

OTHER PUBLICATIONS

Japanese Office Action issued Jul. 2, 2024 in Japanese Application 2023-111329, (with unedited computer-generated English translation), 5 pages.

*Primary Examiner* — Allan W. Olsen
(74) *Attorney, Agent, or Firm* — Oblon, McClelland, Maier & Neustadt, L.L.P.

(57) ABSTRACT

According to an embodiment, a capacitor includes a conductive substrate, a conductive layer, a dielectric layer therebetween, and first and second internal electrodes. The substrate has first and second main surfaces. One partial region of the first main surface is provided with first recesses. A region of the second surface corresponding to a combination of the one partial region and another partial region is provided with second recesses. The conductive layer covers the main surfaces and side walls and bottom surfaces of the recesses. The first internal electrode is provided on the one partial region and electrically connected to the conductive layer. The second internal electrode is provided on the another partial region and electrically connected to the substrate.

5 Claims, 7 Drawing Sheets

(51) Int. Cl.
*H01G 4/30* (2006.01)
*H01G 4/33* (2006.01)
*H01G 4/38* (2006.01)
*H01L 23/522* (2006.01)
*H01G 4/005* (2006.01)

(52) U.S. Cl.
CPC ......... *H01G 4/385* (2013.01); *H01L 23/5223* (2013.01); *H01G 4/005* (2013.01)

(56) References Cited

U.S. PATENT DOCUMENTS

| | | | |
|---|---|---|---|
| 10,181,461 B1 | 1/2019 | Park | |
| 2007/0145449 A1 | 6/2007 | Sato | |
| 2010/0041203 A1 | 2/2010 | Collins | |
| 2010/0118465 A1 | 5/2010 | Onishi | |
| 2013/0161792 A1 | 6/2013 | Tran | |
| 2016/0200568 A1* | 7/2016 | Sadik | B41J 2/1626 438/700 |
| 2018/0033634 A1 | 2/2018 | Matsuo et al. | |
| 2018/0277622 A1 | 9/2018 | Nishiyama | |
| 2019/0066571 A1* | 2/2019 | Goward | G09G 3/3233 |
| 2020/0051749 A1 | 2/2020 | Suemasa | |
| 2020/0219656 A1 | 7/2020 | Higuchi et al. | |
| 2020/0258682 A1* | 8/2020 | Matsuo | H01G 4/33 |
| 2020/0395528 A1* | 12/2020 | Fujii | B41J 2/1642 |
| 2021/0091171 A1* | 3/2021 | Higuchi | H01G 4/33 |

FOREIGN PATENT DOCUMENTS

| | | |
|---|---|---|
| JP | 2009-135310 A | 6/2009 |
| JP | 5023999 B2 | 9/2012 |
| JP | 5644340 B2 | 12/2014 |
| JP | 2018-18965 A | 2/2018 |
| JP | 2018-170440 A | 11/2018 |
| JP | 6481518 B2 | 3/2019 |
| WO | WO 2019/171470 A1 | 9/2019 |
| WO | WO 2019/171750 A1 | 9/2019 |

* cited by examiner

CAPACITOR AND ETCHING METHOD

CROSS-REFERENCE TO RELATED APPLICATIONS

This application is a divisional of and claims benefit under 35 U.S.C. § 120 to U.S. application Ser. No. 16/998,019, filed Aug. 20, 2020, which is based upon and claims the benefit of priority under 35 U.S.C. § 119 from Japanese Patent Application No. 2019-171157, filed Sep. 20, 2019, the entire contents of each of which are incorporated herein by reference.

FIELD

Embodiments described herein relate generally to a capacitor.

BACKGROUND

With the downsizing and upgrading of communication equipment, capacitors to be mounted thereon are desired to be smaller and thinner. As a structure to achieve downsizing and reducing the thickness of the capacitor while maintaining the capacitance density, there is a trench capacitor in which trenches are formed on a substrate to increase the surface area.

DETAILED DESCRIPTION

Figure 1:
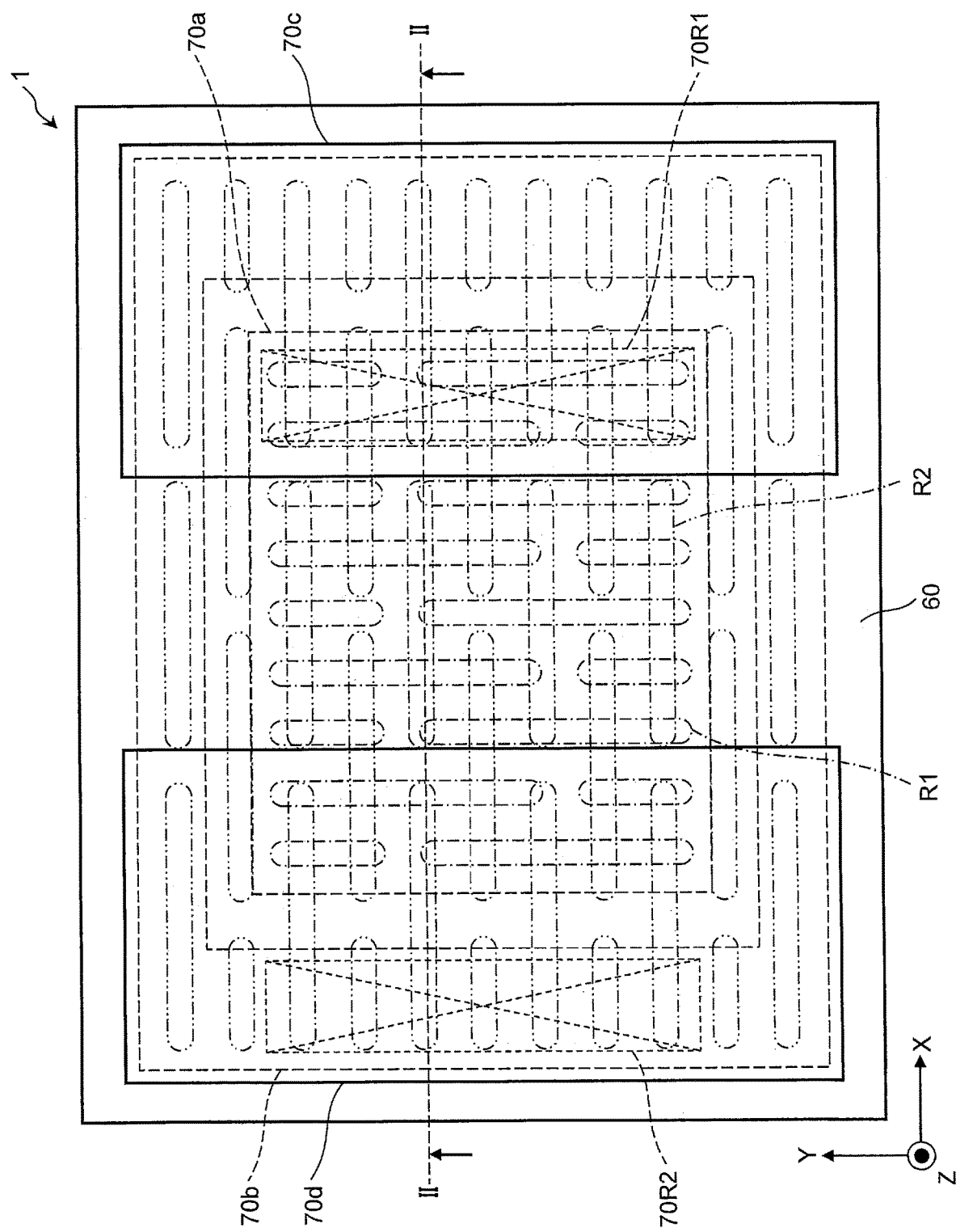
FIG. 1 is a top view of a capacitor according to an embodiment.

A capacitor according to a first aspect comprises: a conductive substrate having a first main surface and a second main surface, one of partial regions of the first main surface being provided with one or more first recesses, and a region of the second surface corresponding to a combination of the one of the partial regions of the first main surface and another one of the partial regions of the first main surface being provided with one or more second recesses; a conductive layer covering the first main surface, the second main surface, side walls and bottom surfaces of the one or more first recesses, and side walls and bottom surfaces of the one or more second recesses; a dielectric layer interposed between the conductive substrate and the conductive layer; a first internal electrode provided on the one of the partial regions of the first main surface and electrically connected to the conductive layer; and a second internal electrode provided on the another one of the partial regions of the first main surface and electrically connected to the conductive substrate.

An etching method according to a second aspect comprises: forming a first catalyst layer containing a noble metal on one main surface of a semiconductor substrate; forming a second catalyst layer containing the noble metal on another main surface of the semiconductor substrate such that the second catalyst layer is different from the first catalyst layer in a mass of the noble metal per unit area; and then supplying an etching agent containing an oxidizer and hydrogen fluoride to the one main surface and the another main surface.

Embodiments will be described in detail below with reference to the accompanying drawings. Note that the same reference numerals denote constituent elements which achieve the same or similar functions throughout all the drawings, and repeat explanations will be omitted.

Figure 2:
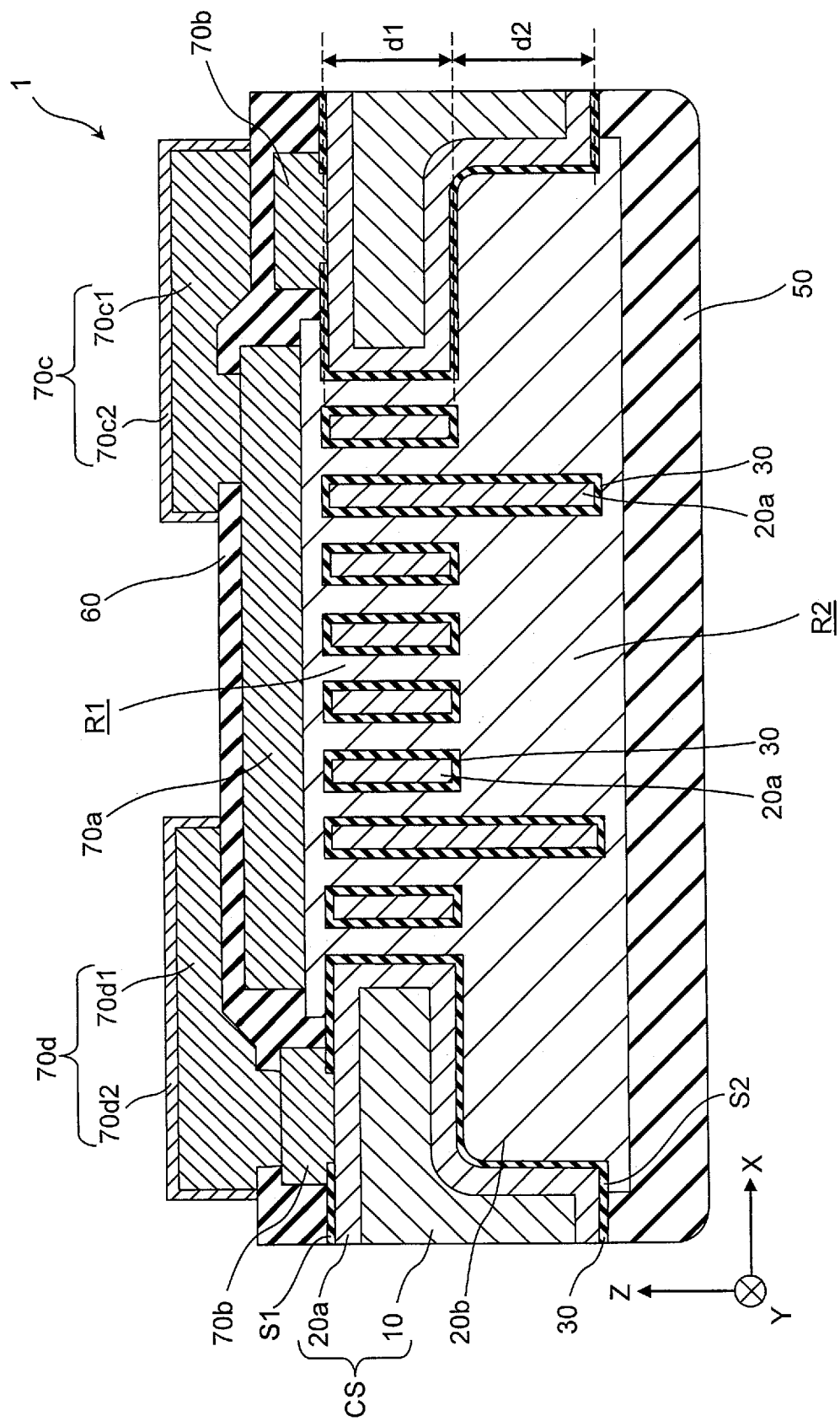
FIG. 2 is a cross-sectional view taken along a line II-II of the capacitor shown in FIG. 1.

FIGS. 1 and 2 show a capacitor according to an embodiment.

A capacitor 1 shown in FIGS. 1 and 2 includes a conductive substrate CS, a conductive layer 20b, and a dielectric layer 30, as shown in FIG. 2.

In each figure, an X direction is a direction parallel to a main surface of the conductive substrate CS, and a Y direction is a direction parallel to the main surface of the conductive substrate CS and perpendicular to the X direction. In addition, a Z direction is a thickness direction of the conductive substrate CS, i.e., a direction perpendicular to the X direction and the Y direction.

The conductive substrate CS is a substrate having electrical conductivity in at least its surface. The conductive substrate CS serves as a lower electrode of the capacitor.

The conductive substrate CS has a first main surface S1, a second main surface S2, and an end face extending from an edge of the first main surface S1 to an edge of the second main surface S2. Here, the conductive substrate CS has a flat and approximately right-angled parallelepiped shape. The conductive substrate CS may have other shapes.

The first main surface, i.e., a top surface of the conductive substrate CS in this embodiment, is provided with first recesses R1 shown in FIGS. 1 to 2. The first recesses R1 are provided only on one of partial regions of the first main surface S1, and are not provided on the rest of the partial regions of the first main surface S1. Here, the first recesses R1 are provided only on a central region of the first main surface S1. The first recesses R1 may be provided on other regions of the first main surface S1 than the central region.

The first recesses R1 are first trenches each having a shape extending in a first direction. Here, the first direction, which is the length direction of the first recesses R1, is the Y direction. The first recesses R1 form a plurality of first rows each of which is constituted by two or more first trenches arranged in the Y direction that is the first direction and which are arranged in a second direction intersecting the first direction, i.e., in the X direction in this embodiment.

Portions of the conductive substrate CS that are each sandwiched between one and the other of adjacent first rows are first main wall parts. On the other hand, portions of the conductive substrate CS that are each sandwiched between one and the other of adjacent first trenches in each of the first rows are first auxiliary wall parts that are first portions. The first auxiliary wall parts are each interposed between adjacent first main wall parts, and serve to suppress collapse thereof. The first trenches may be arranged so as not to generate the first auxiliary wall parts.

A plurality of first recesses R1 are provided on the first main surface in this embodiment, but only one first recess R1 may be provided. The first recesses R1 may be recesses other than trenches, e.g., recesses having circular or square openings, and the shape of the first recesses R1 is not limited to the shape of the above-described trenches.

The second main surface S2, i.e., a lower surface of the conductive substrate CS in this embodiment, is provided with second recesses R2. The second recesses R2 are provided on a region of the second main surface S2 that correspond to a combination of the above-described one of the partial regions of the first main surface S1 on which the first recesses R1 are provided and another one of the partial regions of the first main surface S1. Here, the second recesses R2 are provided on a region including a central region of the second main surface S2 corresponding to the above-described one of the partial regions and a region of the second main surface S2 that surrounds the central region.

The second recesses R2 are second trenches each having a shape extending in a third direction. Here, the third direction, which is the length direction of the second recesses R2, is the X direction. The second recesses R2 form a plurality of second rows each of which is constituted by two or more second trenches arranged in the X direction that is the third direction and which are arranged in a fourth direction intersecting the third direction, i.e., in the Y direction in this embodiment.

Here, the first direction and the third direction are orthogonal to each other, but may intersect diagonally. As will be described below, the first trenches and the second trenches are connected so that capacitors formed in the first trenches and capacitors formed in the second trenches are electrically connected, but if they are electrically connected by other methods, the first direction and the third direction may be parallel.

The "length direction" of the first or second recesses is a length direction of orthogonal projections of the first or second recesses onto a plane perpendicular to a thickness direction of the conductive substrate CS. Accordingly, the fact that the length direction (the first direction) of the first recesses R1 and the length direction (the third direction) of the second recesses R2 intersect each other means that the length direction of the orthogonal projections of the first recesses onto the plane perpendicular to the thickness direction of the conductive substrate CS intersects the length direction of the orthogonal projections of the second recesses onto this plane.

Portions of the conductive substrate CS that are each sandwiched between one and the other of adjacent second rows are second main wall parts. Portions of the conductive substrate CS that are each sandwiched between adjacent second trenches in each of the second rows are second auxiliary wall parts that are second portions. The second auxiliary wall parts are each interposed between adjacent second main wall parts, and serve to suppress collapse thereof. The second trenches may be arranged so as not to generate the second auxiliary wall parts.

Here, a plurality of second recesses R2 are provided on the second main surface S2, but only one second recess R2 may be provided. The second recesses R2 may be recesses other than trenches, e.g. recesses having circular or square openings, and the shape of the second recesses R2 is not limited to the shape of the above-described trenches.

It is preferable that a dimension of an opening of each of the first recesses R1 and the second recesses R2 is 0.3 μm or more. Note that the dimensions of the openings of the first recesses R1 and the second recesses R2 are diameters or widths of the openings of the first recesses R1 and the second recesses R2. Here, the dimensions of the openings of the first recesses R1 and the second recesses R2 are dimensions in a direction perpendicular to the length directions thereof. When these dimensions are reduced, a larger electric capacitance can be achieved. However, if these dimensions are reduced, it becomes difficult to form a stacked structure including the dielectric layer 30 and the conductive layer 20b in the first recesses R1 and the second recesses R2.

If the first recesses R1 and the second recesses R2 are the first trenches and the second trenches, respectively, the length of the openings thereof is within a range of 1 μm to 1,000 μm according to an example, and within a range of 10 μm to 500 μm according to another example. If the first recesses R1 and the second recesses R2 are the first trenches and the second trenches, respectively, the width of the openings thereof, i.e., a dimension of the first auxiliary wall parts in the second direction and a dimension of the second auxiliary wall parts in the fourth direction, are within a range of 0.3 μm to 100 μm according to an example, and within a range of 0.5 μm to 10 μm according to another example.

A distance between the first recesses R1 and a distance between the second recesses R2 are each preferably 0.1 μm or more. When these distances are reduced, a larger electric capacitance can be achieved. However, when these distances are reduced, a portion of the conductive substrate CS sandwiched between the first recesses R1 and a portion of the conductive substrate CS sandwiched between the second recesses R2 are likely to be damaged.

If the first recesses R1 and the second recesses R2 are the first trenches and the second trenches, respectively, a distance between openings of trenches adjacent in the width direction, i.e., a thickness of the first main wall part or a thickness of the second main wall part, is within a range of 0.1 μm to 100 μm according to an example, and within a range of 0.5 μm to 10 μm according to another example.

If the first recesses R1 and the second recesses R2 are the first trenches and the second trenches, respectively, a dimension of the first auxiliary wall part in the first direction and a dimension of the second auxiliary wall part in the third direction are within a range of 0.1 μm to 100 μm according to an example, and within a range of 0.5 μm to 10 μm according to another example.

The dimensions related to the first recesses R1 and those of the second recesses R2 may be equal to or different from each other.

The dimensions of the second trenches, the second main wall parts, and the second auxiliary wall parts may be the same as those of the first trenches, the first main wall parts, and the first auxiliary wall parts, respectively. Alternatively, one or more of the dimensions of the second trenches, the second main wall parts, and the second auxiliary wall parts may be different from one or more of the dimensions of the first trenches, the first main wall parts, and the first auxiliary wall parts.

For example, the length of the second trenches may be smaller than that of the first trenches, or the width of the second trenches may be larger than that of the first trenches. In a case where a depth of the second trenches is larger than that of the first trenches, the second main wall parts are more likely to be damaged, such as collapsing, than the first main wall parts. When the above structure is adopted, it is possible to make the second main wall parts difficult to be damaged.

A depth d1 of the first recesses R1 is within a range of 1 μm to 500 μm according to an example, and within a range of 10 μm to 200 μm according to another example. On the other hand, a depth d2 of the second recesses R2 is within a range of 1 µm to 500 µm according to an example, and within a range of 10 µm to 200 µm according to another example.

The depth d2 of the second recesses is preferably larger than the depth d1 of the first recesses. A ratio d2/d1 of the depth d2 to the depth d1 is within a range of 1 µm to 10 µm according to an example, and within a range of 1 µm to 3 µm according to another example. From the viewpoint of increasing the electric capacitance, the ratio d2/d1 is preferably large. However, if the ratio d2/d1 is increased, the second main wall parts are likely to be damaged.

A sum of the depth d1 of the first recesses R1 and the depth d2 of the second recesses R2, d1+d2, is equal to or greater than a thickness T of the conductive substrate CS. If this configuration is adopted, the first recesses R1 and the second recesses R2 are connected to each other at positions where they intersect to form through holes.

A ratio of the sum d1+d2 to the thickness T, (d1+d2)/T, is preferably within a range of 1 to 1.4, and more preferably within a range of 1.1 to 1.3. From the viewpoint of increasing the electric capacitance, the ratio (d1+d2)/T is preferably large. In addition, from the viewpoint of improving an electrical connection between portions of the conductive layer 20b that are located on side walls and bottom surfaces of the first recesses R1 and portions of the conductive layer 20b that are located on side walls and bottom surfaces of the second recesses R2, the ratio (d1+d2)/T is preferably large. However, when the depths d1 and d2 are increased, the mechanical strength of the capacitor 1 decreases.

Note that the ratio (d1+d2)/T may be less than 1. In this case, the first recesses R1 and the second recesses R2 do not form the through holes at the positions where they intersect. Therefore, in this case, in addition to providing the first recesses R1 and the second recesses R2, through holes are provided at arbitrary positions of the substrate 10.

The first recesses R1 and the second recesses R2 can have various shapes. For example, as long as orthogonal projections of the first recesses R1 and the second recesses R2 onto a plane perpendicular to the Z direction intersect each other, they may each have a curved or bent shape, or may each be circular or square.

Here, cross sections of the first recesses R1 and the second recesses R2 parallel to their depth directions are rectangular. However, these cross sections need not be rectangular and may have, for example, a tapered shape.

The conductive substrate CS includes a substrate 10 and a conductive layer 20a.

The substrate 10 has the same shape as that of the conductive substrate CS. The substrate 10 is, for example, an insulating substrate, a semiconductor substrate, or a conducting substrate. The substrate 10 is preferably a semiconductor substrate. The substrate 10 is preferably a substrate containing silicon, such as a silicon substrate. Such a substrate can be processed using semiconductor processes.

The conductive layer 20a is provided on the substrate 10. The conductive layer 20a is made of, for example, polysilicon doped with impurities to improve electrical conductivity, or a metal or alloy such as molybdenum, aluminum, gold, tungsten, platinum, nickel, or copper. The conductive layer 20a may have a single-layer structure or a multi-layer structure.

A thickness of the conductive layer 20a is preferably within a range of 0.05 µm to 5 µm, and more preferably within a range of 0.1 µm to 2 µm. If the conductive layer 20a is thin, the possibility exists that a discontinuous portion may be generated in the conductive layer 20a, or a sheet resistance of the conductive layer 20a may be excessively increased. When the conductive layer 20a is thickened, manufacturing costs increase.

Here, the substrate 10 is a semiconductor substrate such as a silicon substrate, and the conductive layer 20a is a high-concentration doped layer that is a surface region of the semiconductor substrate doped with impurities at a high concentration. In this case, the first and second main wall parts, if thin enough, can be entirely doped with impurities at a high concentration.

If the substrate 10 has a high electrical conductivity, the conductive layer 20a may be omitted, and the substrate 10 may be used as the conductive substrate CS. For example, if the substrate 10 is a semiconductor substrate made of a semiconductor doped with P-type or N-type impurities, or a metal substrate, the conductive layer 20a can be omitted. In this case, at least a surface region of the substrate 10, e.g., the entire substrate 10, serves as the conductive layer 20a.

The conductive layer 20b serves as an upper electrode of the capacitor. The conductive layer 20b covers the first main surface S1, the second main surface S2, the side walls and the bottom surfaces of the first recesses R1, and the side walls and the bottom surfaces of the second recesses R2.

The conductive layer 20b is made of, for example, polysilicon doped with impurities to improve the electrical conductivity, or a metal or alloy such as molybdenum, aluminum, gold, tungsten, platinum, nickel, or copper. The conductive layer 20b may have a single-layer structure or a multi-layer structure.

A thickness of the conductive layer 20b is preferably within a range of 0.05 µm to 5 µm, and more preferably within a range of 0.1 µm to 2 µm. If the conductive layer 20b is thin, the possibility exists that a discontinuous portion may be generated in the conductive layer 20b, or a sheet resistance of the conductive layer 20b may be excessively increased. If the conductive layer 20b is thick, pattern formation of the conductive layer 20b becomes less accurate, or the pattern formation itself becomes difficult. In addition, it may be difficult to form the conductive layer 20a and the dielectric layer 30 with sufficient thicknesses.

In FIG. 2, the conductive layer 20b is provided so that the first recesses R1 and the second recesses R2 are completely filled with the conductive layer 20b and the dielectric layer 30. The conductive layer 20b may be a layer that is conformal to a surface of the conductive substrate CS. That is, the conductive layer 20b may be a layer having an approximately uniform thickness. In this case, the first recesses R1 and the second recesses R2 are not completely filled with the conductive layer 20b and the dielectric layer 30.

The conductive layer 20b covers a region of the first main surface S1 on which the first recesses R1 are provided with the dielectric layer 30 sandwiched therebetween. The conductive layer 20b does not cover the other regions of the first main surface S1.

The dielectric layer 30 is interposed between the conductive substrate CS and the conductive layer 20b. The dielectric layer 30 is a layer that is conformal to the surface of the conductive substrate CS. The dielectric layer 30 electrically insulates the conductive substrate CS and the conductive layer 20b from each other.

The dielectric layer 30 is made of, for example, an organic dielectric or an inorganic dielectric. As the organic dielectric, for example, polyimide can be used. As the inorganic dielectric, a ferroelectric can be used. Paraelectrics such as silicon nitride, silicon oxide, silicon oxynitride, titanium oxide, and tantalum oxide, are preferable. These paraelectrics have a small change in dielectric constant with temperature. Therefore, when the paraelectrics are used for the dielectric layer 30, the heat resistance of the capacitor 1 can be improved.

A thickness of the dielectric layer 30 is preferably within a range of 0.005 μm to 0.5 μm, and more preferably within a range of 0.01 μm to 0.1 μm. When the dielectric layer 30 is thin, the possibility exists that a discontinuous portion may be generated in the dielectric layer 30, and the conductive substrate CS and the conductive layer 20b may be short-circuited. Further, if the dielectric layer 30 is thinned, a withstand voltage is lowered even if there is no short circuit, and a possibility of short-circuiting when a voltage is applied is increased. When the dielectric layer 30 is thickened, the withstand voltage increases, but the electric capacitance decreases.

The dielectric layer 30 is opened at a position of a region of the first main surface S1 on which the first recesses R1 are not provided, i.e., a region not covered by the conductive layer 20b. That is, the dielectric layer 30 allows the conductive layer 20a to be exposed at this position. A portion of the dielectric layer 30 that is provided on the first main surface S1 is opened in a frame shape.

This capacitor 1 further includes an insulating layer 50, an insulating layer 60, a first internal electrode 70a, a second internal electrode 70b, a first external electrode 70c, and a second external electrode 70d.

The first internal electrode 70a is provided on the region of the first main surface S1 on which the first recesses R1 are provided. The first internal electrode 70a is electrically connected to the conductive layer 20b. Here, the first internal electrode 70a is a rectangular electrode provided on a portion of the conductive layer 20b that covers the central region of the first main surface S1 with the dielectric layer 30 sandwiched therebetween.

The second internal electrode 70b is provided on the region of the first main surface S1 on which the first recesses R1 are not provided. The second internal electrode 70b is electrically connected to the conductive substrate CS. The second internal electrode 70b is provided on a portion of the conductive layer 20a that is provided on the first main surface S1 and not covered by the conductive layer 20b. Here, the second internal electrode 70b is a frame-shaped electrode arranged to surround the first internal electrode 70a.

The first internal electrode 70a and the second internal electrode 70b may have a single-layer structure or a multi-layer structure. Each layer constituting the first internal electrode 70a and the second internal electrode 70b is made of, for example, a metal such as molybdenum, aluminum, gold, tungsten, platinum, copper, nickel, titanium, or an alloy containing one or more of them.

The insulating layer 60 covers portions of the conductive layer 20b and the dielectric layer 30 that are located on the first main surface S1, and further covers the first internal electrode 70a and the second internal electrode 70b. The insulating layer 60 partially opens at a position of a part of the first internal electrode 70a and a position of a part of the second internal electrode 70b.

The insulating layer 60 may have a single-layer structure or a multi-layer structure. Each layer constituting the insulating layer 60 is made of, for example, an inorganic insulator such as silicon nitride and silicon oxide, or an organic insulator such as polyimide and novolac resin.

The first external electrode 70c is provided on the insulating layer 60. The first external electrode 70c is in contact with the first internal electrode 70a at a position of one or more openings provided in the insulating layer 60. Thereby, the first external electrode 70c is electrically connected to the first internal electrode 70a. In FIG. 1, a region 70R1 is a region where the first external electrode 70c and the first internal electrode 70a are in contact with each other.

The second external electrode 70d is provided on the insulating layer 60. The second external electrode 70d is in contact with the second internal electrode 70b at a position of the remaining opening(s) provided in the insulating layer 60. Thereby, the second external electrode 70d is electrically connected to the second internal electrode 70b. In FIG. 1, a region 70R2 is a region where the second external electrode 70d and the second internal electrode 70b are in contact with each other.

The first external electrode 70c has a stacked structure including a first metal layer 70c1 and a second metal layer 70c2. The second external electrode 70d has a stacked structure including a first metal layer 70d1 and a second metal layer 70d2.

The first metal layers 70c1 and 70d1 are made of, for example, aluminum. The second metal layers 70c2 and 70d2 cover upper and end surfaces of the first metal layers 70c1 and 70d1, respectively. The second metal layers 70c2 and 70d2 are constituted by, for example, a stacked film of a nickel or nickel alloy layer and a gold layer, or a stacked film of a gold layer and a palladium layer. The second metal layers 70c2 and 70d2 can be omitted.

The first external electrode 70c or the first internal electrode 70a may further include a barrier layer at a position adjacent to an interface therebetween. The second external electrode 70d or the second internal electrode 70b may further include a barrier layer at a position adjacent to an interface therebetween, too. As a material of the barrier layer, for example, titanium can be used.

The insulating layer 50 covers a portion of the conductive layer 20b that is located on the second main surface S2 side. The insulating layer 50 may have a single-layer structure or a multi-layer structure. Each layer constituting the insulating layer 50 is made of, for example, an inorganic insulator such as silicon nitride and silicon oxide, or an organic insulator such as polyimide and novolac resin.

This capacitor 1 is manufactured by, for example, the following method. An example of a method of manufacturing the capacitor 1 will be described below with reference to FIGS. 3 to 9.

Figure 3:
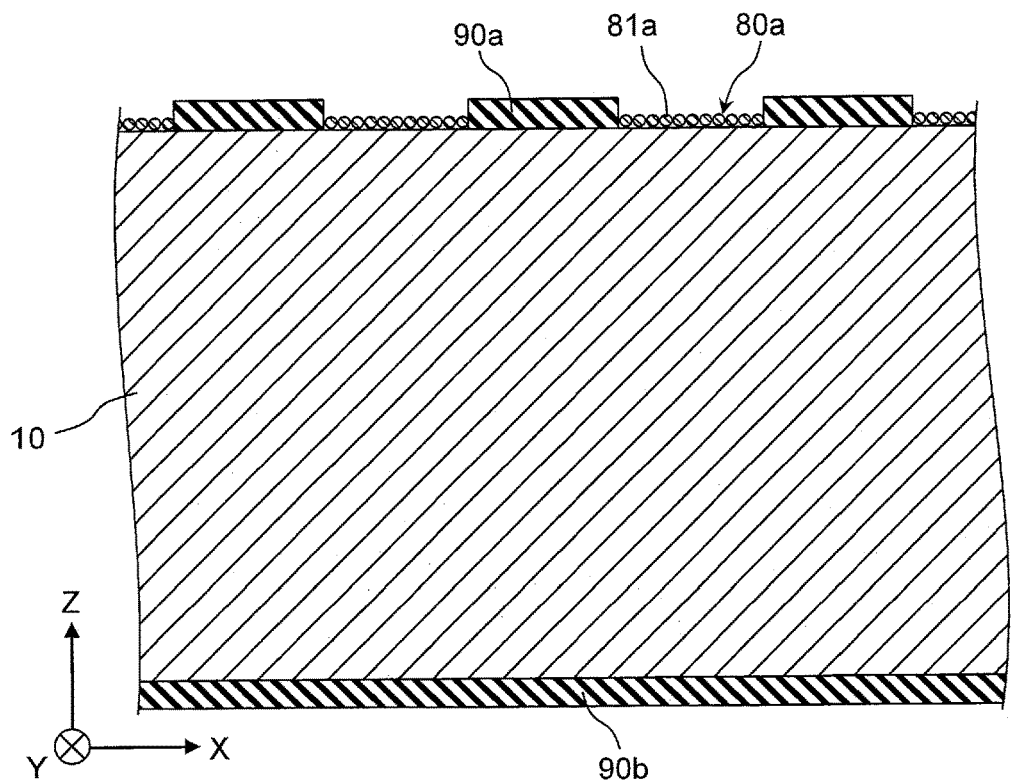
FIG. 3 is a cross-sectional view showing a process in the manufacture of the capacitor shown in FIGS. 1 and 2.
Figure 4:
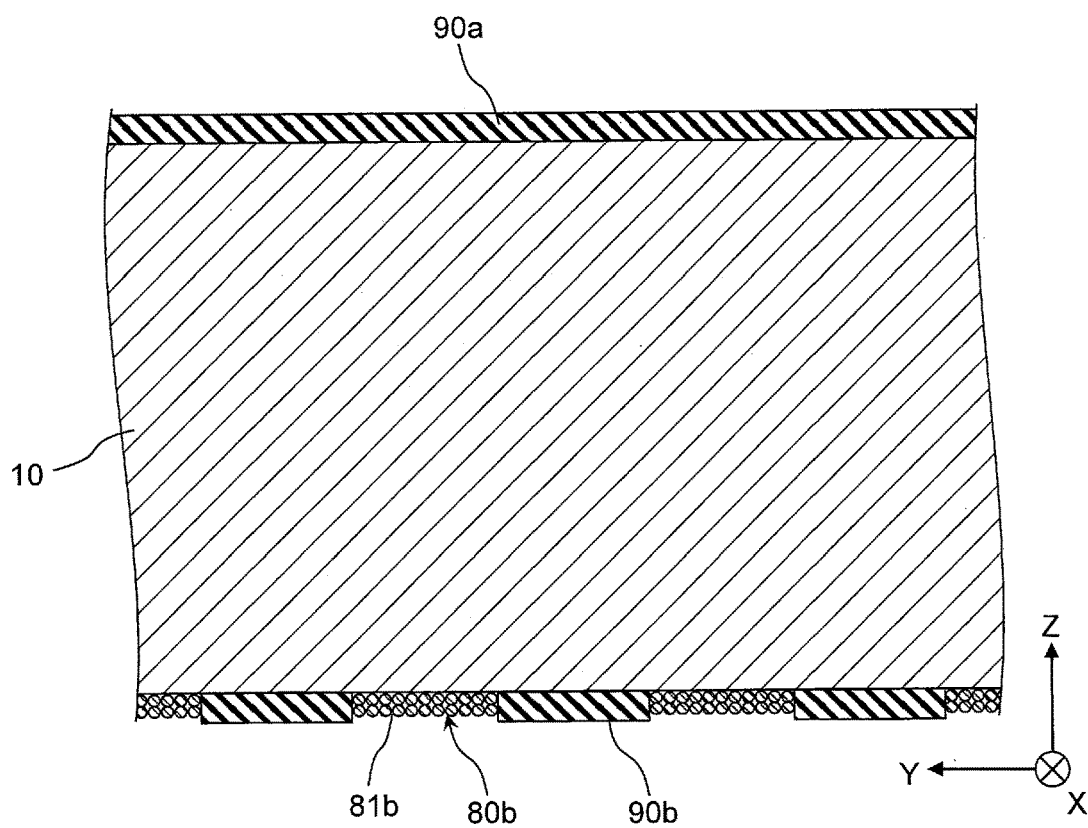
FIG. 4 is another cross-sectional view showing the process of FIG. 3.

In this method, the substrate 10 shown in FIGS. 3 and 4 is first prepared. Here, as an example, it is supposed that the substrate 10 is a single-crystal silicon wafer. A plane orientation of the single-crystal silicon wafer is not particularly limited, but in this embodiment, a silicon wafer whose main surface is a (100) plane is used. As the substrate 10, a silicon wafer whose main surface is a (110) plane can also be used.

Next, the recesses are formed on the substrate 10 by MacEtch (Metal-Assisted Chemical Etching).

That is, as shown in FIGS. 3 and 4, a first catalyst layer 80a and a second catalyst layer 80b each containing a noble metal are first formed on the substrate 10. The first catalyst layer 80a and the second catalyst layer 80b are formed so as to partially cover one main surface (hereinafter, referred to as the "first surface") of the substrate 10 and the other main surface (hereinafter, referred to as the "second surface"), respectively.

Specifically, a first mask layer 90a is first formed on the first surface of the substrate 10.

The first mask layer 90a is opened at positions corresponding to the first recesses R1. The first mask layer 90a prevents portions of the first surface that are covered with the first mask layer 90a from coming into contact with a noble metal to be described later.

Examples of the material of the first mask layer 90a include organic materials such as polyimide, fluororesin, phenol resin, acrylic resin, and novolac resin, and inorganic materials such as silicon oxide and silicon nitride.

The first mask layer 90a can be formed by, for example, existing semiconductor processes. The first mask layer 90a made of an organic material can be formed by, for example, photolithography. The first mask layer 90a made of an inorganic material can be formed by, for example, deposition of an inorganic material layer by vapor deposition, formation of a mask by photolithography, and patterning of the inorganic material layer by etching. Alternatively, the first mask layer 90a made of an inorganic material can be formed by oxidation or nitriding of the surface region of the substrate 10, formation of a mask by photolithography, and patterning of an oxide or nitride layer by etching. The first mask layer 90a can be omitted.

Next, the first catalyst layer 80a is formed on regions of the first surface that are not covered with the first mask layer 90a. The first catalyst layer 80a is, for example, a discontinuous layer containing a noble metal. Here, as an example, it is supposed that the first catalyst layer 80a is a particulate layer formed of first catalyst particles 81a containing a noble metal.

The noble metal is, for example, one or more of gold, silver, platinum, rhodium, palladium, and ruthenium. The first catalyst layer 80a and the first catalyst particles 81a may further contain a metal other than a noble metal, such as titanium.

The first catalyst layer 80a can be formed by, for example, electroplating, reduction plating, or displacement plating. The first catalyst layer 80a may also be formed by application of a dispersion containing noble metal particles, or vapor deposition such as evaporation or sputtering. In addition, the first catalyst layer 80a may be formed by an ink-jet method or an aerosol method using fine noble metal particles. Of these methods, the displacement plating is particularly favorable because it is possible to directly and evenly deposit the noble metal on the regions of the first surface that are not covered with the first mask layer 90a.

Next, a second mask layer 90b is formed on the second surface.

The second mask layer 90b is opened at positions corresponding to the second recesses R2. The second mask layer 90b prevents portions of the second surface that are covered with the second mask layer 90b from coming into contact with the noble metal.

As a material of the second mask layer 90b, for example, those exemplified for the first mask layer 90a can be used. The second mask layer 90b can be formed by, for example, the same method as described above for the first mask layer 90a.

Next, the second catalyst layer 80b is formed on regions of the second surface that are not covered with the second mask layer 90b. The second catalyst layer 80b is, for example, a discontinuous layer containing a noble metal. Here, as an example, it is supposed that the second catalyst layer 80b is a particulate layer formed of second catalyst particles 81b containing a noble metal.

As materials of the second catalyst layer 80b and the second catalyst particles 81b, for example, those exemplified for the first catalyst layer 80a and the first catalyst particles 81a can be used. The second catalyst layer 80b can be formed by, for example, the same method as described above for the first catalyst layer 80a.

In a case where the depth d1 of the first recesses R1 and the depth d2 of the second recesses R2 are made different, the second catalyst layer 80b may be formed so that a mass of the noble metal per unit area is different from that of the first catalyst layer 80a. For example, in a case where the depth d2 of the second recesses R2 is made larger than the depth d1 of the first recesses R1, the second catalyst layer 80b may be formed so that the mass of the noble metal per unit area is larger than that of the first catalyst layer 80a. By making the amount of the noble metal different, surface areas of the catalyst can be made different.

In a case where the depth d2 of the second recesses R2 is made larger than the depth d1 of the first recesses R1, a mass M1 of the noble metal per unit area in the first catalyst layer 80a is within a range of 10 g/m2 to 100 g/m2 according to an example in which gold is used as the noble metal. In this case, a mass M2 of the noble metal per unit area in the second catalyst layer 80b is within a range of 50 g/m2 to 150 g/m2 according to an example. Then, a ratio M2/M1 is within a range of 1 to 15 according to an example.

An etching method in which a mass of a noble metal per unit area is made different between a catalyst layer formed on one main surface of a semiconductor substrate and a catalyst layer formed on the other main surface can be used not only for the manufacture of the above-described capacitor 1 but also for the manufacture of other structures.

It is possible for the first mask layer 90a and the second mask layer 90b to be formed on the first surface and the second surface, respectively, and subsequently, for one of the first catalyst layer 80a and the second catalyst layer 80b to be formed and then the other one of them to be formed. Alternatively, it is also possible for, after forming the second mask layer 90b on the second surface, the second catalyst layer 80b to be formed, and subsequently, for the first mask layer 90a to be formed on the first surface and then the first catalyst layer 80a to be formed.

Next, the substrate 10 is etched with an assist from a noble metal as a catalyst to form the recesses on each of the first surface and the second surface.

Figure 5:
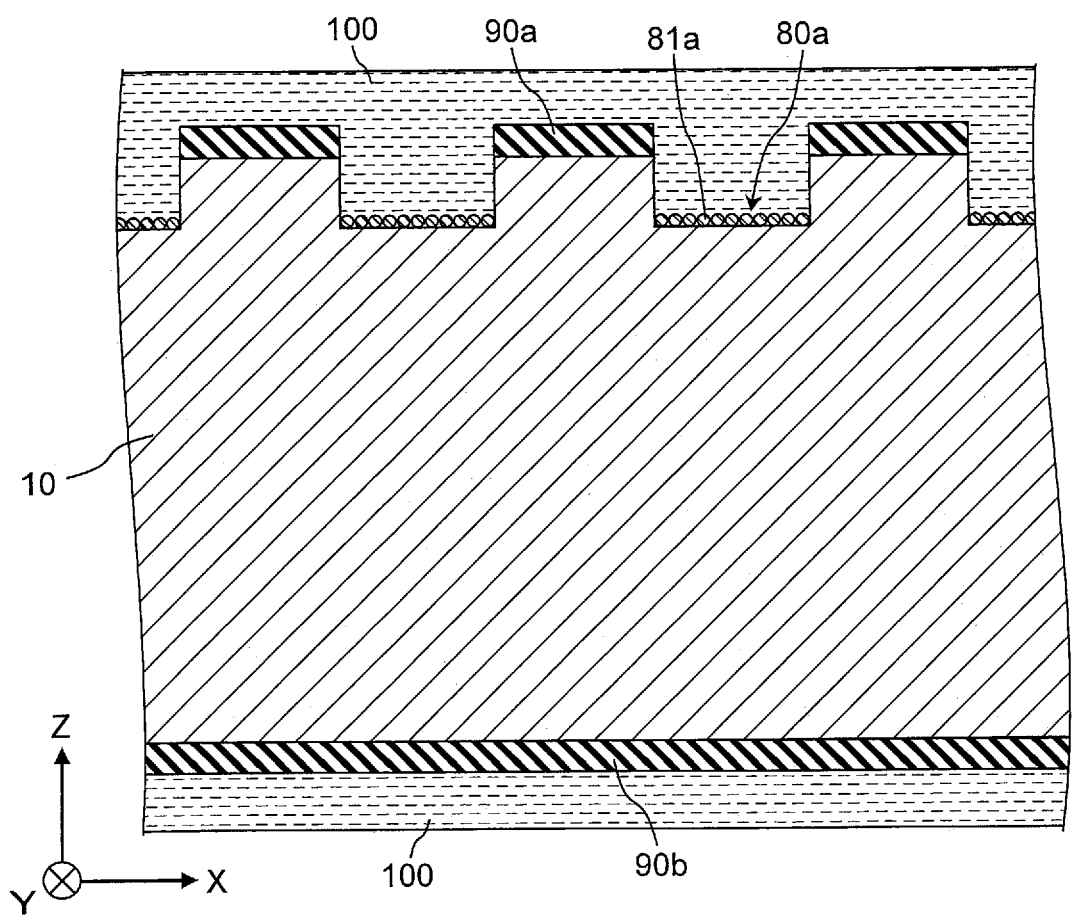
FIG. 5 is a cross-sectional view showing another process in the manufacture of the capacitor shown in FIGS. 1 and 2.
Figure 6:
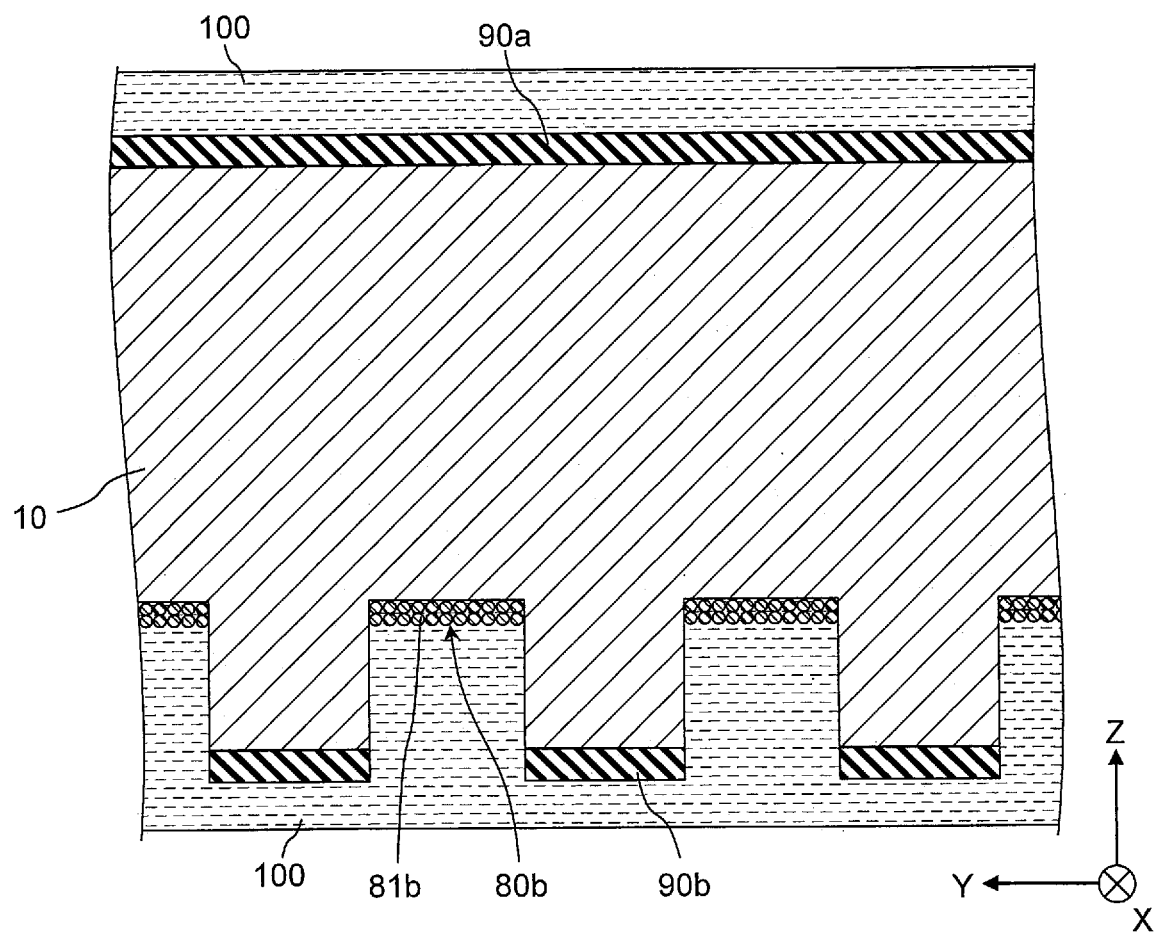
FIG. 6 is another cross-sectional view showing the process of FIG. 5.

Specifically, as shown in FIGS. 5 and 6, the substrate is etched with an etching agent 100. For example, the substrate 10 is immersed in the etching agent 100 in liquid form to bring the etching agent 100 into contact with the substrate 10.

The etching agent 100 contains an oxidizer and hydrogen fluoride.

The concentration of hydrogen fluoride in the etching agent 100 is preferably within a range of 1 mol/L to 20 mol/L, more preferably within a range of 5 mol/L to 10 mol/L, and further preferably within a range of 3 mol/L to 7 mol/L. When the hydrogen fluoride concentration is low, it is difficult to achieve a high etching rate. When the hydrogen fluoride concentration is high, excess side etching may occur.

The oxidizer can be selected from, for example, hydrogen peroxide, nitric acid, $AgNO_3$, $KAuCl_4$, $HAuCl_4$, $K_2PtCl_6$, $H_2PtCl_6$, $Fe(NO_3)_3$, $Ni(NO_3)_2$, $Mg(NO_3)_2$, $Na_2S_2O_8$, $K_2S_2O_8$, $KMnO_4$, and $K_2Cr_2O_7$. Hydrogen peroxide is favorable as the oxidizer because no harmful byproducts are produced, and a semiconductor element is not contaminated.

The concentration of the oxidizer in the etching agent 100 is preferably within a range of 0.2 mol/L to 8 mol/L, more preferably within a range of 2 mol/L to 4 mol/L, and further preferably within a range of 3 mol/L to 4 mol/L.

The etching agent 100 may further contain a buffer. The buffer contains, for example, at least one of ammonium fluoride and ammonia. As an example, the buffer is ammonium fluoride. As another example, the buffer is a mixture of ammonium fluoride and ammonia.

The etching agent 100 may further contain other components such as water.

When such an etching agent 100 is used, the material of the substrate 10, i.e., silicon in this embodiment, is oxidized only in regions of the substrate 10 that are close to the first catalyst particles 81a or the second catalyst particles 81b. Oxide generated thereby is dissolved and removed by hydrofluoric acid. Therefore, only the portions close to the first catalyst particles 81a or the second catalyst particles 81b are selectively etched.

The first catalyst particles 81a move toward the second surface as etching progresses, where etching similar to the above is performed. As a result, as shown in FIG. 5, at the position of the first catalyst layer 80a, etching proceeds from the first surface toward the second surface in a direction perpendicular to the first surface.

On the other hand, the second catalyst particles 81b move toward the first surface as etching progresses, where etching similar to the above is performed. As a result, as shown in FIG. 6, at the position of the second catalyst layer 80b, etching proceeds from the second surface toward the first surface in a direction perpendicular to the second surface.

Figure 7:
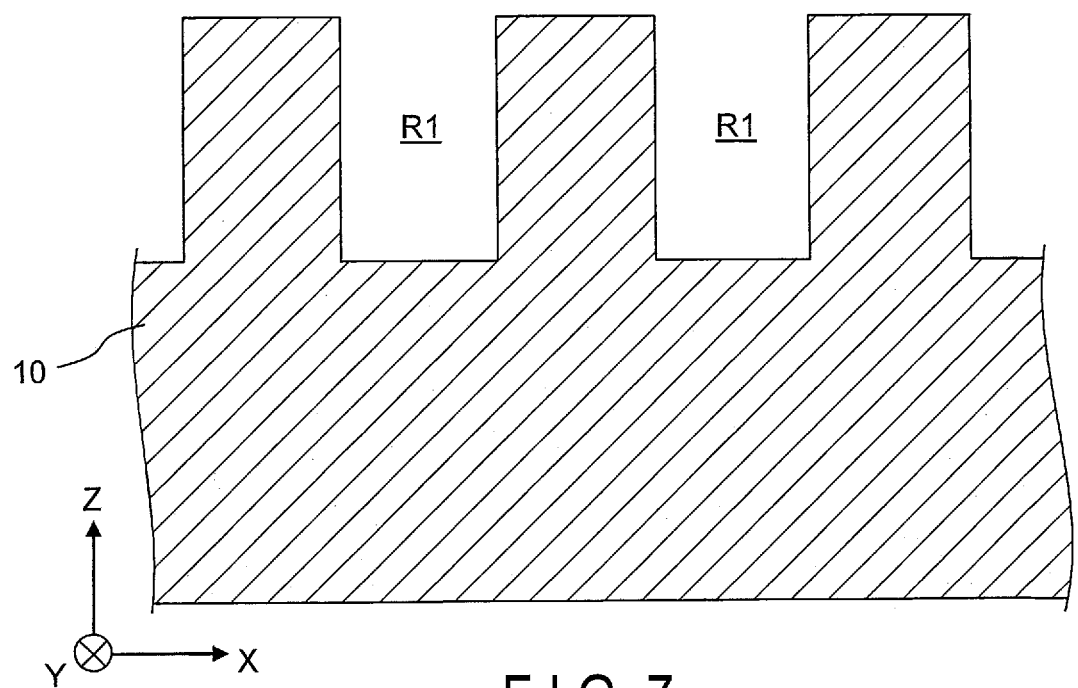
FIG. 7 is a cross-sectional view showing a structure obtained by the processes of FIGS. 3 to 6.
Figure 8:
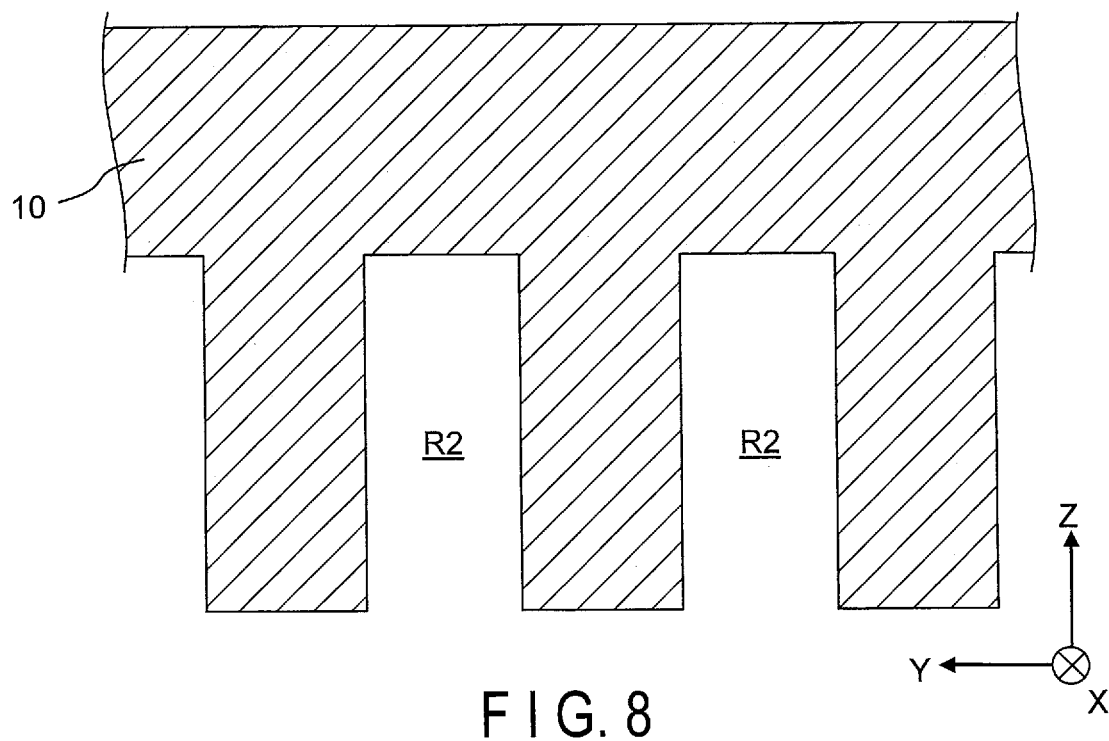
FIG. 8 is another cross-sectional view showing a structure of FIG. 3.

In this way, as shown in FIGS. 7 and 8, the first recesses R1 are formed on the first surface, and the second recesses R2 are formed on the second surface. When a sum of the depths of these recesses is equal to or greater than the thickness of the substrate 10, these recesses are connected to each other at positions where they intersect. In this way, the through holes are formed in the above intersections.

Thereafter, the first mask layer 90a, the second mask layer 90b, the first catalyst layer 80a, and the second catalyst layer 80b are removed from the substrate 10. One or more of the first mask layer 90a, the second mask layer 90b, the first catalyst layer 80a, and the second catalyst layer 80b may not be removed from the substrate 10.

Next, the conductive layer 20a shown in FIG. 2 is formed on the substrate 10 to obtain the conductive substrate CS. The conductive layer 20a can be formed by, for example, doping the surface region of the substrate 10 with impurities at a high concentration. The conductive layer 20a made of polysilicon can be formed by, for example, LPCVD (low pressure chemical vapor deposition). The conductive layer 20a made of metal can be formed by, for example, electrolytic plating, reduction plating, or displacement plating.

A plating solution is a liquid containing a salt of a metal to be plated. As the plating solution, a general plating solution such as a copper sulfate plating solution containing copper sulfate pentahydrate and sulfuric acid, a copper pyrophosphate plating solution containing copper pyrophosphate and potassium pyrophosphate, and a nickel sulfamate plating solution containing nickel sulfamate and boron, can be used.

The conductive layer 20a is preferably formed by a plating method using a plating solution containing a salt of a metal to be plated, a surfactant, and carbon dioxide in a supercritical or subcritical state. In this plating method, the surfactant is interposed between particles made of supercritical carbon dioxide and a continuous phase of a solution containing a salt of a metal to be plated. That is, the surfactant is allowed to form micelles in the plating solution, and supercritical carbon dioxide is incorporated in these micelles.

In a normal plating method, the supply of the metal to be plated may be insufficient in the vicinity of the bottom portions of the recesses. This is particularly noticeable when a ratio D/W of the depth D to a width or diameter W of the recesses is large.

The micelles incorporating supercritical carbon dioxide can easily enter narrow gaps. As the micelles move, so does the solution containing a salt of a metal to be plated. Therefore, according to a plating method using a plating solution containing a salt of a metal to be plated, a surfactant, and carbon dioxide in a supercritical or subcritical state, the conductive layer 20a having a uniform thickness can be easily formed.

Next, the dielectric layer 30 is formed on the conductive layer 20a. The dielectric layer 30 can be formed by, for example, CVD (chemical vapor deposition). Alternatively, the dielectric layer 30 can be formed by oxidizing, nitriding, or oxynitriding the surface of the conductive layer 20a.

Next, the conductive layer 20b is formed on the dielectric layer 30. As the conductive layer 20b, for example, a conductive layer made of polysilicon or metal is formed. Such a conductive layer 20b can be formed by, for example, the same method as described above for the conductive layer 20a.

Next, the conductive layer 20b is patterned, and an opening is formed on the dielectric layer 30. The opening is formed at the position of the region of the first main surface S1 on which the first recesses R1 are not provided. Here, a portion of the dielectric layer 30 that is located on the first main surface S1 is opened in a frame shape. This opening can be formed by, for example, formation of a mask by photolithography and patterning by etching.

Next, a metal layer is formed and patterned to obtain the first internal electrode 70a and the second internal electrode 70b. The first internal electrode 70a and the second internal electrode 70b can be formed by, for example, a combination of film formation by sputtering or plating, and photolithography.

Thereafter, the insulating layer 60 is formed. The insulating layer 60 is opened at the positions corresponding to a part of the first internal electrode 70a and a part of the second internal electrode 70b. The insulating layer 60 can be formed by, for example, a combination of film formation by CVD and photolithography.

Next, the first external electrode 70c and the second external electrode 70d are formed on the insulating layer 60. Specifically, first, the first metal layers 70c1 and 70d1 are formed. Next, the second metal layers 70c2 and 70d2 are formed. The first metal layers 70c1 and 70d1 and the second metal layers 70c2 and 70d2 can be formed by, for example, a combination of film formation by sputtering or plating, and photolithography.

Thereafter, the insulating layer 50 is formed. Further, the structure thus obtained is diced. In the manner described above, the capacitor 1 shown in FIGS. 1 and 2 is obtained.

Figure 9:
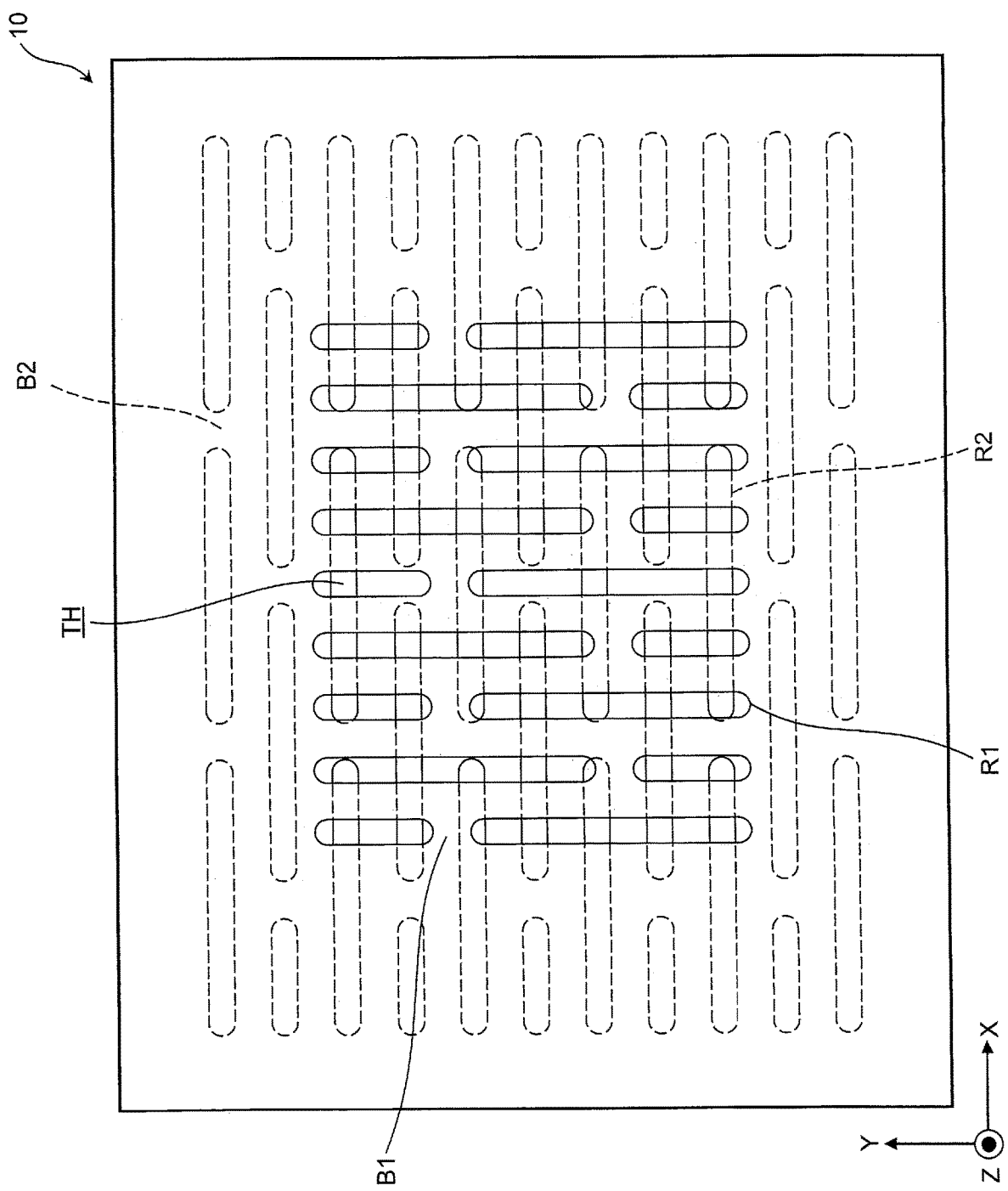
FIG. 9 is a diagram showing an example of an arrangement of first and second recesses.

In this method, it is preferable to form the first recesses R1 and the second recesses R2 as shown in FIG. 9

In FIG. 9, the first recesses R1 are first trenches each extending in the Y direction that is the first direction. These first trenches form a plurality of first rows each of which is constituted by two or more first trenches arranged in the first direction and which are arranged in the second direction intersecting the first direction, i.e., in the X direction in this embodiment. Two adjacent first rows differ in terms of the position of a first portion B1 sandwiched between two or more first trenches arranged in the first direction.

The second recesses R2 are second trenches each extending in the X direction as the third direction. These second trenches form a plurality of second rows each of which is constituted by two or more second trenches arranged in the third direction and which are arranged in the fourth direction intersecting the third direction, i.e., in the Y direction in this embodiment. Two adjacent second rows differ in terms of the position of a second portion B2 sandwiched between two or more second trenches arranged in the third direction.

Here, the "position of a first portion" is a position in the first direction. Here, the "position of a second portion" is a position in the third direction.

In the above method, the first catalyst layer 80a and the second catalyst layer 80b are formed by, for example, plating. In this case, the materials of the first catalyst layer 80a and the second catalyst layer 80b are supplied from the plating solution.

In a region where an area proportion of the openings in the first mask layer 90a is small, the amount of the above material to be supplied to the first surface exposed at the positions of the openings is larger than a region where the area proportion of the openings in the first mask layer 90a is large. Therefore, in the region where the area proportion of the openings in the first mask layer 90a is small, the amount of the first catalyst particles 81a per unit area of the first catalyst layer 80a is larger than the region where the area proportion of the openings in the first mask layer 90a is large.

Similarly, in a region where an area proportion of the openings in the second mask layer 90b is small, the amount of the above material to be supplied to the second surface exposed at the positions of the openings is larger than a region where the area proportion of the openings in the second mask layer 90b is large. Therefore, in the region where the area proportion of the openings in the second mask layer 90b is small, the amount of the second catalyst particles 81b per unit area of the second catalyst layer 80b is larger than the region where the area proportion of the openings in the second mask layer 90b is large.

The amount of the catalyst particles affects an etching rate. That is, the larger the amount of the catalyst particles, the higher the etching rate.

In a case where the positions of the first portions B1 are made coincident between two adjacent first rows, a difference in the area proportion of the openings in the first mask layer 90a is large between regions in the vicinity of the positions corresponding to the first portions B1 and the other regions. In this case, therefore, a large difference is generated in the depth of the first recesses R1 between the regions in the vicinity of the first portions B1 and the other regions.

Similarly, in a case where the positions of the second portions B2 are made coincident between two adjacent second rows, a difference in the area proportion of the openings in the second mask layer 90b is large between regions in the vicinity of the positions corresponding to the second portions B2 and the other regions. In this case, therefore, a large difference is generated in the depth of the second recesses R2 between the regions in the vicinity of the second portions B2 and the other regions.

In the arrangement shown in FIG. 9, the positions of the first portions B1 are different between two adjacent first rows. Thus, a difference in the area proportion of the openings in the first mask layer 90a between the regions in the vicinity of the positions corresponding to the first portions B1 and the other regions is smaller than the case where the positions of the first portions B1 are made coincident between two adjacent first rows. When the arrangement shown in FIG. 9 is adopted, therefore, variation in depth of the first recesses R1 can be made small.

Similarly, in the arrangement shown in FIG. 9, the positions of the second portions B2 are different between two adjacent second rows. Thus, a difference in the area proportion of the openings in the second mask layer 90b between the regions in the vicinity of the positions corresponding to the second portions B2 and the other regions is smaller than the case where the positions of the second portions B2 are made coincident between two adjacent second rows. When the arrangement shown in FIG. 9 is adopted, therefore, variations in the depth of the second recesses R2 can be made small.

In addition, in the case of adopting the arrangement shown in FIG. 9, in film formation to be performed after the first recesses R1 and the second recesses R2 are formed, for example, deposited materials can be supplied more uniformly. Thus, a high film thickness uniformity can be achieved.

In the above-described method, etching for forming the first recesses R1 and etching for forming the second recesses R2 are performed at the same time. These etching may be performed separately. In this case, the amount of the noble metal per unit area may be made equal between the first catalyst layer 80a and the second catalyst layer 80b.

The first recesses R1 and the second recesses R2 are formed using MacEtch in the above-described method, but at least one of the first recesses R1 and the second recesses R2 may be formed by other methods. For example, when forming recesses with small depths or forming recesses with large widths or diameters to be sufficiently distant from one another, an etching method other than MacEtch, such as reactive ion etching (RIE), may be used.

In this capacitor 1, the stacked structure including the dielectric layer 30 and the conductive layer 20b is provided not only on the first main surface S1 and in the first recesses R1 but also on the second main surface S2 and in the second recesses R2. Therefore, this capacitor 1 can achieve a large electric capacitance.

In addition, this capacitor 1 is easily manufactured, as will be described below.

In a case where the first recesses R1 are provided on the entire first main surface S1, and the first internal electrode 70a and the second internal electrode 70b are arranged so as to face the first main surface S1, a complex structure would need to be adopted. For example, it would be necessary to provide an insulating layer for electrically insulating the second internal electrode 70b from the conductive layer 20b, and form through holes for electrically connecting the second internal electrode 70b to the conductive substrate CS in this insulating layer. Then, for electrically connecting the second internal electrode 70b to the conductive substrate CS, positions of the through holes formed in this insulating layer and the dielectric layer 30 must be on the first main wall parts. If the first main wall parts are thin, formation of these through holes would require high positional accuracy.

In the capacitor 1 described with reference to FIGS. 1 and 2, the first recesses R1 are provided only on one of partial regions of the first main surface S1. The second recesses R2 are provided on the region of the second main surface S2 that correspond to a combination of the above one of the partial regions of the first main surface S1 and another one of the partial regions of the first main surface S1. In addition, the first internal electrode 70a is provided on the above one of the partial regions of the first main surface S1, and is electrically connected to the conductive layer 20b. On the other hand, the second internal electrode 70b is provided on the above another one of the partial regions of the first main surface S1, and is electrically connected to the conductive substrate CS.

Since the first recesses R1 are provided only on the one of the partial the regions of the first main surface S1, the region of the first main surface S1 on which the first recesses R1 are not provided does not need to be covered with the conductive layer 20b. Thus, an insulating layer for electrically insulating the second internal electrode 70b from the conductive layer 20b can be omitted, and in this case, through holes would not need to be formed in this insulating layer.

In addition, in the capacitor 1 described with reference to FIGS. 1 and 2, the electrical connection between the second internal electrode 70b and the conductive substrate CS is performed at the region on which the first recesses R1 are not provided. In the process of forming an opening in the dielectric layer 30 for electrically connecting the second internal electrode 70b to the conductive substrate CS, high positional accuracy is not required.

In addition, in this capacitor 1, the first recesses R1 and the second recesses R2 are the first and second trenches having length directions intersecting each other, and a sum of their depths is equal to or greater than the thickness of the conductive substrate CS. Thus, when the first recesses R1 and the second recesses R2 are formed, the through holes TH shown in FIG. 9 are generated at the positions where they intersect. Therefore, there is no need to further perform a step of forming through holes in addition to the step of forming the first recesses R1 and the second recesses R2.

Then, in this capacitor 1, an electrical connection between the portions of the above stacked structure that are located on the first main surface S1 and the second main surface S2 is performed using the through holes TH. Thus, both of the first internal electrode 70a and the second internal electrode 70b can be disposed on one side of the capacitor 1. The capacitor 1 adopting such a configuration can be manufactured in a relatively small number of process steps.

Furthermore, in this capacitor 1, both of the first internal electrode 70a and the second internal electrode 70b are disposed on one side of the capacitor 1. Thus, the first external electrode 70c and the second external electrode 70d can also be disposed on one side of the capacitor 1. The capacitor 1 adopting such a configuration can be easily mounted on a wiring board, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An etching method comprising:
   forming a first catalyst layer containing a noble metal on one main surface of a semiconductor substrate;
   forming a second catalyst layer containing the noble metal on another main surface of the semiconductor substrate such that the second catalyst layer is different from the first catalyst layer in a mass of the noble metal per unit area; and
   then supplying an etching agent containing an oxidizer and hydrogen fluoride to the one main surface and the another main surface.

2. The method according to claim 1, wherein the first catalyst layer is formed on one of partial regions of the one main surface, and the second catalyst layer is formed on a region of the another main surface corresponding to a combination of the one of the partial regions of the one main surface and another one of the partial regions of the one main surface.

3. The method according to claim 2, wherein the first and second catalyst layers are formed such that the second catalyst layer has a larger mass of the noble metal per unit area than the first catalyst layer.

4. The method according to claim 1, wherein, by the supply of the etching agent, one or more first recesses are formed at a position of the first catalyst layer on the one main surface, and one or more second recesses are formed at a position of the second catalyst layer on the another main surface.

5. The method according to claim 4, wherein the one or more first recesses are one or more first trenches, the one or more second recesses are one or more second trenches, a length direction of the one or more first trenches and a length direction of the one or more second trenches intersect each other, and the one or more first trenches and the one or more second trenches are connected to each other at intersections thereof.

* * * * *